(12) United States Patent  
Meeuwsen et al.

(10) Patent No.: US 12,142,491 B2  
(45) Date of Patent: Nov. 12, 2024

(54) PACKAGED ELECTRONIC DEVICE

(71) Applicant: Ampleon Netherlands B.V., Nijmegen (NL)

(72) Inventors: Frans Meeuwsen, Nijmegen (NL); Jurgen Raben, Nijmegen (NL)

(73) Assignee: Ampleon Netherlands B.V., Nijmegen (NL)

( * ) Notice: Subject to any disclaimer, the term of this patent is extended or adjusted under 35 U.S.C. 154(b) by 460 days.

(21) Appl. No.: 17/431,650

(22) PCT Filed: Feb. 28, 2020

(86) PCT No.: PCT/NL2020/050136  
§ 371 (c)(1),  
(2) Date: Aug. 17, 2021

(87) PCT Pub. No.: WO2020/180179  
PCT Pub. Date: Sep. 10, 2020

(65) Prior Publication Data  
US 2022/0139727 A1     May 5, 2022

(30) Foreign Application Priority Data  
Mar. 1, 2019 (NL) ..................................... 2022669

(51) Int. Cl.  
   *H01L 21/56*       (2006.01)  
   *H01L 23/047*    (2006.01)  
   *H01L 23/00*       (2006.01)

(52) U.S. Cl.  
CPC .......... *H01L 21/565* (2013.01); *H01L 23/047* (2013.01); *H01L 24/97* (2013.01)

(58) Field of Classification Search  
CPC .... H01L 21/565–566; H01L 2924/161–16798  
See application file for complete search history.

(56) References Cited

U.S. PATENT DOCUMENTS 5,801,074 A    9/1998   Kim et al.  
5,943,558 A    8/1999   Kim et al.  
               (Continued)

FOREIGN PATENT DOCUMENTS

JP     2002261579 A    9/2002

OTHER PUBLICATIONS

PCT International Search Report and Written Opinion, Application No. PCT/NL2020/050136, mailed Jun. 12, 2020, 13 pages.

*Primary Examiner* — Jay C Chang  
*Assistant Examiner* — Mikka Liu  
(74) *Attorney, Agent, or Firm* — McDonnell Boehnen Hulbert & Berghoff LLP

(57) ABSTRACT

Example embodiments relate to packaged electronic devices. One example packaged electronic device includes a substrate. The packaged electronic device also includes a plurality of leads fixated relative to the substrate in a spaced apart manner. Additionally, the packaged electronic device includes a solidified molding compound that is fixedly connected to the plurality of leads. The solidified molding includes an upper ring part that extends away from the leads in a direction away from the substrate. Further, the packaged electronic device includes an electronic component mounted on the substrate and electrically connected to the leads. In addition, the packaged electronic device includes a lid having a lid base and a lid rim that extends towards the upper ring part. The lid rim is connected to the upper ring part using an adhesive. Each of the lid rim and upper ring part include an inner portion and an outer portion.

15 Claims, 6 Drawing Sheets

(56) References Cited

U.S. PATENT DOCUMENTS

| | | |
|---|---|---|
| 10,199,303 B1 | 2/2019 | Sanchez et al. |
| 2004/0011699 A1* | 1/2004 | Park ................. H01L 23/49537 206/832 |
| 2019/0051571 A1* | 2/2019 | Sanchez ............. H01L 21/4842 |

* cited by examiner

PACKAGED ELECTRONIC DEVICE

CROSS-REFERENCE TO RELATED APPLICATIONS

The present application is a national stage entry of PCT/NL2020/050136 filed Feb. 28, 2020, which claims priority to NL 2022669 filed Mar. 1, 2019, the contents of each of which are hereby incorporated by reference.

The present invention relates to a packaged electronic device, and to a method for manufacturing the packaged electronic device.

Packaged electronic devices are well known in the art. An example of a packaged electronic device 100 is shown in FIG. 1. The package comprises a substrate 102, typically being copper or copper-based and acting as heatsink, flange and/or die pad. The package further comprises a plurality of leads 103 that are fixated relative to substrate 102 in a spaced apart manner Such fixation can for example be achieved using a solidified molding compound 104 as shown in the figure.

Prior to molding, leads 103 are part of a lead frame. More in particular, the lead frame comprises a lead frame body to which the leads are connected using temporary connections such as connecting tabs. Similar connecting tabs are used to fixate the leads relative to each other. These latter connecting tabs are often referred to as dam-bars. Moreover, prior to molding, substrate 102 is connected to the lead frame body by a temporary connection such a tie-bar including a rivet.

Solidified molding compound 104 in FIG. 1 is fixedly connected to the plurality of leads 103 and comprises an upper ring part 106 that extends away from leads 103 in a direction away from substrate 102 and a lower ring part 105 that connects the substrate to the plurality of leads 103.

An electronic component 120 is mounted on substrate 102. Component 120 is electrically connected to leads 103, for example by means of one or more bondwires 121.

The known package further comprises a lid 107, which comprises a lid base 107A and a lid rim 108 that extends towards upper ring part 106. Lid rim 108 is connected to upper ring part 106 by means of an adhesive, such as glue 122.

Inside packaged device 100, an air cavity 109 is formed in which an electronic component 120 is arranged. Other packages are known in which electronic component 120 is completely surrounded by solidified molding compound 104. In these packages, the solidified molding compound serves as a lid of the package. However, for radiofrequency applications, the dielectric constant of molding compound 104 may introduce unwanted losses. For some applications an air cavity 109 is therefore preferred.

To manufacture device 100, the following steps are generally followed. As a first step, a lead frame is provided that comprises a substrate 102 and a plurality of leads 103. Typically, the lead frame comprises a plurality of substrates 102 and a plurality of leads 103 for each of these substrates such that multiple devices can be made substantially simultaneously. The leads and substrates are typically connected to the lead frame body using temporary connections.

As a next step, a molding compound 104 is applied, for example by means of transfer molding or injection molding, and this molding compound is allowed to solidify thereby forming upper ring part 106 and lower ring part 105. This latter part further fixates substrate 102 relative to the plurality of leads 103.

After molding compound 104 has solidified to a sufficient extent, electronic component 120 is mounted on substrate 102 and electrical connections are made between electronic component 120 and leads 103. For example, bondwires 121 are wire bonded between leads 103 and bond pads on electrical component 120.

As a next step, a lid 107 is provided for each packaged device to be manufactured. Glue 122 or another adhesive is applied or has been previously applied to lid rim 108 and/or upper ring part 106. Lid rim 108 and upper ring part 106 are then aligned and coupled together using the adhesive. Typically, the coupling of lid rim 108 and upper ring part 106 is performed while pressure and/or heat and/or UV exposure is/are applied.

After the packaged devices have been formed, they can be isolated and removed from the lead frame body by cutting or punching through the temporary connections.

A further packaged electronic device is known from U.S. Pat. No. 7,004,325 B2. In this device, each of the lid rim and upper ring part comprises an inner portion and an outer portion relative to a center of the packaged electronic device. The outer portion and inner portion of the lid rim are connected to the outer portion and inner portion of the upper ring part, respectively, using said adhesive. Moreover, these portions co-define a channel in which the adhesive is arranged.

The lid rim and upper ring part may comprise a protrusion and a recess, respectively. These structures allow for a convenient alignment of the lid relative to a remainder of the package.

An even further packaged electronic device, as described by the preamble of claim 1, is known from U.S. Pat. No. 10,199,303 B1. Also in this device, each of the lid rim and upper ring part comprises an inner portion and an outer portion relative to a center of the packaged electronic device. The outer portion of the lid rim and the outer portion of the upper ring part form so-called hard-stops. These hard-stops contact or physically abut.

A common problem with the packages as described above is known as glue flow-out or bleeding. This problem relates to the situation in which the glue or components thereof flow into the inside of the package or to the outside. The presence of glue or components thereof may have a detrimental effect on the reliability of the packaged device and/or package dimensions.

A packaged electronic device similar to the preamble of claim 1 is known from US 2019/051571 A1.

An object of the present invention is to provide a solution to the abovementioned problem. This object is achieved with the packaged electronic device as defined in claim 1 that is characterized in that the inner portions of the lid rim and upper ring part abut each other essentially without the adhesive being arranged in between them, and in that the channel widens in an outward direction relative to the center of the packaged electronic device.

The inner portion of the upper ring part and the inner portion of the lid rim preferably have corresponding surfaces such that these surfaces fully lie against each other. These surfaces are preferably flat.

When the lid and upper ring of the device according to the invention are brought into alignment and heat, pressure, and UV exposure are subsequently applied, glue flow-out or bleeding is prevented due to the fact that the inner portions of the lid rim and upper ring abut each other thereby forming a mechanical barrier preventing glue from reaching the cavity. Moreover, the adhesive that is present in between the outer portions of the lid rim and upper ring is forced away from the inner portions due to the channel widening in the outward direction. Accordingly, the flow resistance decreases in the outward direction causing the adhesive to flow in the outward direction instead of in the inward direction. This latter direction could result in glue flow-our or bleeding.

A further advantage is that the abutment of the inner portions of the lid rim and the upper ring part result in a well-defined height of the packaged device as this parameter does not depend on a variable amount of adhesive in between the lid rim and upper ring part.

The channel may exit at an outside of the packaged electronic device. Having a channel that is open at one end prevents air pockets from forming inside the adhesive that would degrade reliability of the packaged device.

The channel may widen in the outward direction in a substantially continuous manner. This means that the cross section of the channel does at least not decrease in the outward direction.

The outer portion of the lid rim or upper ring part may comprise a depression and the other of the outer portion of the lid rim and upper ring part a protrusion that extends in the depression. Using a protrusion and recess allows for a convenient alignment in the lateral plane of the package. More in particular, the protrusion and depression may be shaped to allow alignment of the lid relative to the upper ring part during application of the lid. It is convenient if the channel starts directly adjacent the inner portion of the lid rim or upper ring part and in front of the protrusion as seen from the center of the packaged electronic device.

The inner portion of the lid rim may comprise a first flank and the inner portion of the upper ring part may comprise a second flank, which flanks abut each other and each extend substantially parallel to the substrate, and wherein the depression and the protrusion are formed adjacent to the flanks.

The depression can be arranged in the lid rim. In this case, the protrusion may comprise a third flank connected to the second flank and extending therefrom towards the lid rim. The protrusion may further comprise a fourth flank connected to the third flank and ending at an outside surface of the packaged device. A part of the channel formed between the fourth flank and an opposing flank of the depression is preferably wider than a part of the channel formed between the third flank and an opposing flank of the depression. Moreover, the channel is open at an outside surface of the package device, and closed off at an opposing end of the channel due to the abutment of the first and second flanks.

Alternatively, the depression can be arranged in the upper ring part. In this case, the protrusion may comprise a fifth flank connected to the first flank and extending therefrom towards the upper ring part. The protrusion may further comprise a sixth flank connected to the fifth flank and ending at an outside surface of the packaged electronic device. A part of the channel formed between the sixth flank and an opposing flank of the depression is preferably wider than a part of the channel formed between the fifth flank and an opposing flank of the depression. Moreover, the channel is open at an outside surface of the package device, and closed off at an opposing end of the channel due to the abutment of the first and second flanks. The depression and protrusion may each extend along the entire circumference of the lid rim or upper ring part. Furthermore, viewed in a direction perpendicular to the substrate, a height of the protrusion may be larger than a maximum inner size of the channel taken in a direction perpendicular to the substrate.

Generally, prior to attaching the lid to the upper ring part, adhesive is applied or is already present in the depression. Typically, the volume of adhesive used is such that, when the lid and upper ring part are attached, the adhesive essentially completely fills the channel without being present in between the inner portions of the lid rim and upper ring part and inside the cavity. The depression may comprise an inwardly curved region and the protrusion may comprise an outwardly curved region. The depression may be formed as a groove and the protrusion may be formed as a ridge.

The depression may be arranged in the lid rim, and the adhesive may comprise a b-stage adhesive, such as a b-stage epoxy resin. With a b-stage adhesive, the step of adhesive application, and the step of connecting lid rim and upper ring part by a final curing process need not be performed directly after each other. For example, the b-stage adhesive may be arranged in the depression of the lid, and may be partially cured, after which the lid is stored prior to further use.

Alternatively, the depression can be arranged in the upper ring part, and the adhesive may comprise an a-stage adhesive, such as an a-stage epoxy resin. As partially assembled packages, in which the electronic devices have already been mounted, are not stored but are processed directly after mounting the electronic device, it is more convenient to use an a-stage adhesive.

The device may further comprise a cavity in between the substrate and the lid that is free from the molding compound, wherein the electronic component is arranged in the cavity. The abutment of the inner portions of the lid rim and upper ring may form a mechanical barrier that prevented glue from reaching the cavity during connecting the upper ring part and lid rim to each other using the adhesive by application of heat and/or pressure and/or UV exposure. Furthermore, each lead may comprise a mounting region near an inward end of the lead that is free of molding compound. The packaged electronic device may further comprise electrical connections, such as one or more bondwires, that, on one end are connected to the mounting region of a respective lead and on another end to a terminal of the electronic component. The terminal may comprise a bondpad on the electronic component.

The substrate may comprise a flange, a heatsink, a die pad for mounting one or more semiconductor dies, a further package, or a printed circuit board, and/or wherein the packaged electronic device has been manufactured using a quad flat no leads (QFN) lead frame, a power quad flat no leads (PQFN) lead frame, a dual flat no leads (DFN), or a power dual flat no leads (PDFN) lead frame.

The molding compound may comprise one or more materials from the group consisting thermoplasts or thermosets.

The molding compound may comprise a lower ring part that fixates the plurality of leads relative to the substrate. For example, during a step of injection of transfer molding, in which the leads and the substrate are held apart, the molding compound will flow around the leads and substrate. After solidification, the leads and substrate become mutually fixated by the solidified molding compound and by the lower ring part thereof in particular. Alternatively, the solidified molding compound, more in particular the upper ring part, and the plurality of leads are connected to the substrate.

The electronic component may comprise an integrated circuit (IC) chip, a microelectromechanical systems (MEMS) chip, an optical sensor, and/or a semiconductor chip comprising one or more transistors for example a power amplifier semiconductor die.

The lid can be made from the same molding compound as said solidified molding compound or other material (e.g. thermoplast).

According to a further aspect, the present invention provides a method for manufacturing the packaged electronic device and comprises the steps of:

a) providing a lead frame comprising a lead frame body and a substrate and a plurality of leads;
b) applying a molding compound, for example by means of transfer or injection molding, to the leads and substrate;
c) allowing the applied molding compound to solidify thereby fixating the leads relative to the substrate in a spaced apart manner, wherein the solidified molding compound comprises an upper ring part that extends away from the leads in a direction away from the substrate;
d) mounting an electronic component on the substrate and electrically connecting the electronic component to the leads;
e) providing a lid having a lid base and a lid rim that extends away from the lid base, wherein each of the lid rim and upper ring part comprises an inner portion and an outer portion relative to a center of the packaged electronic device to be manufactured, wherein an adhesive has solely been applied to the outer portion of at least one of the lid rim and upper ring part;
f) positioning the lid and upper ring such that the inner portions of the lid rim and upper ring part abut each other, wherein the outer portions of the lid rim and upper ring part are shaped such that they, after being positioned, co-define a channel that widens in an outward direction relative to said center of the packaged electronic device, said positioning resulting in the formation of a cavity in between the substrate and the lid in which the electric component is arranged, wherein the abutment of the inner portions of the lid rim and upper ring forms a mechanical barrier; and
g) connecting the upper ring part and lid rim to each other using the applied adhesive by the application of heat and/or pressure and/or UV exposure, wherein the mechanical barrier prevents glue from reaching the cavity during said connecting the upper ring part and lid rim to each other.

In the method according to the invention, the adhesive is solely applied to the outer portion(s) of the lid rim and the upper ring part. As described above, the shape of the widening channel and the mechanical barrier provided by the abutment of the inner portions of the lid rim and the upper ring part ensure that substantially no glue is flowing or bleeding into the package cavity.

The outer portion of the lid rim and upper ring part may each be configured as the outer portion of the lid rim and the outer portion of the upper ring part as described in conjunction with the packaged electronic device, in which the outer portion of the lid rim or upper ring part comprises a depression and the other of the outer portion of the lid rim and upper ring part a protrusion that extends in said depression. In this case, the adhesive is solely applied in the depression. Furthermore, the depression may be arranged in the lid rim and the adhesive may comprise a b-stage adhesive. In this case, step e) may comprise the steps of e1) applying the adhesive to the lid rim, e2) heating the adhesive to remove a majority of solvent from the adhesive, and e3) storing the lid prior to further use.

The lead frame may comprise a lead frame body and a plurality of substrates, and, for each of the substrates, a plurality of leads, wherein the substrates and leads are connected to the lead frame body using one or more temporary connections, such as connecting tabs, dam-bars, or tie-bars including rivets. In this case, steps b)-g) may be performed on all the substrates and leads of the lead frame substantially simultaneously. The method may then further comprise obtaining a plurality of said packaged electronic devices by means of sawing, punching or cutting through the temporary connections after having performed step g).

Next, the invention will be described in more detail referring to the appended drawings, wherein.

Figure 1:
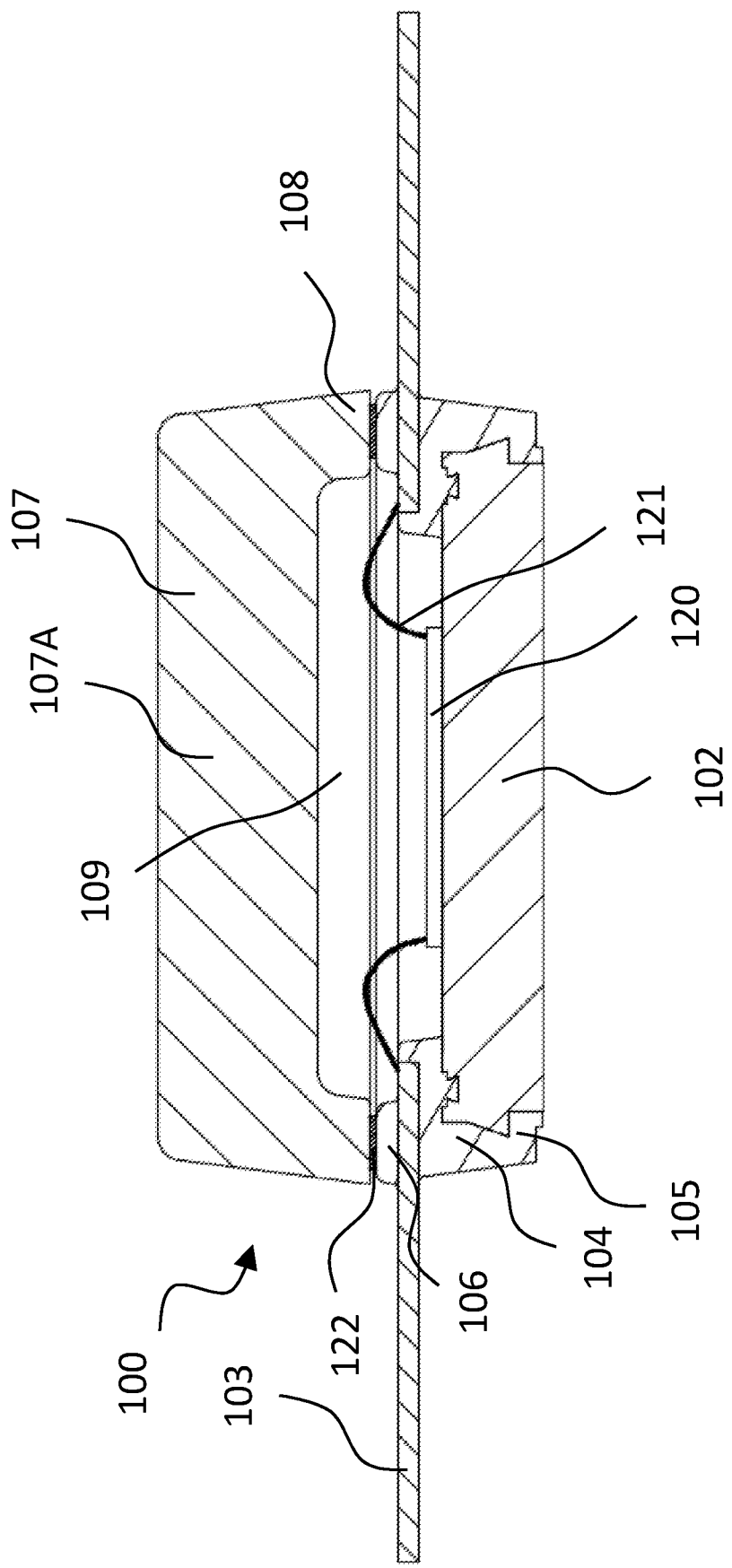
FIG. 1 illustrates a cross section of a known packaged electronic device.
Figure 2A:
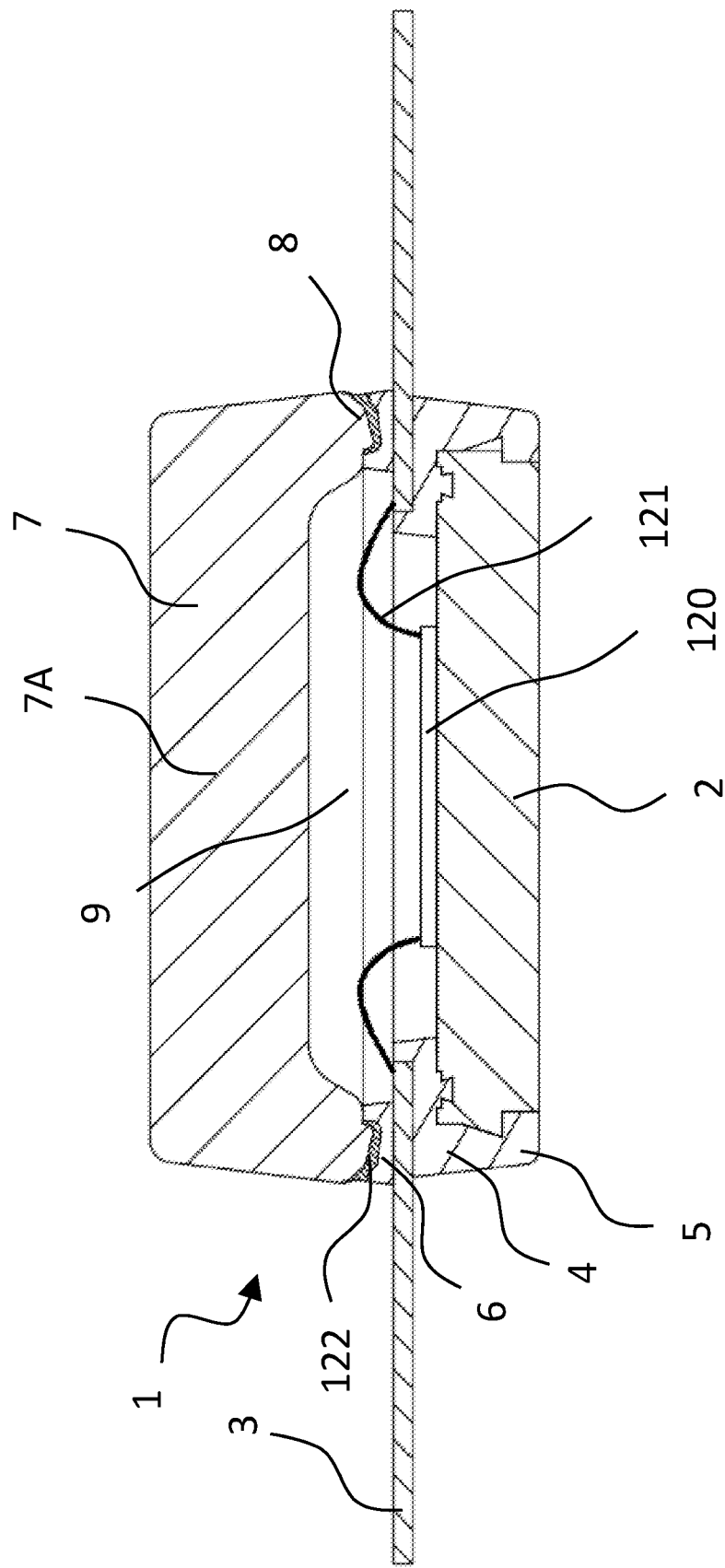
FIG. 2A illustrates a cross section of a first embodiment of a packaged electronic device in accordance with the invention, and FIG. 2B a corresponding detailed view of the connection between the lid rim and upper ring part.
Figure 2B:
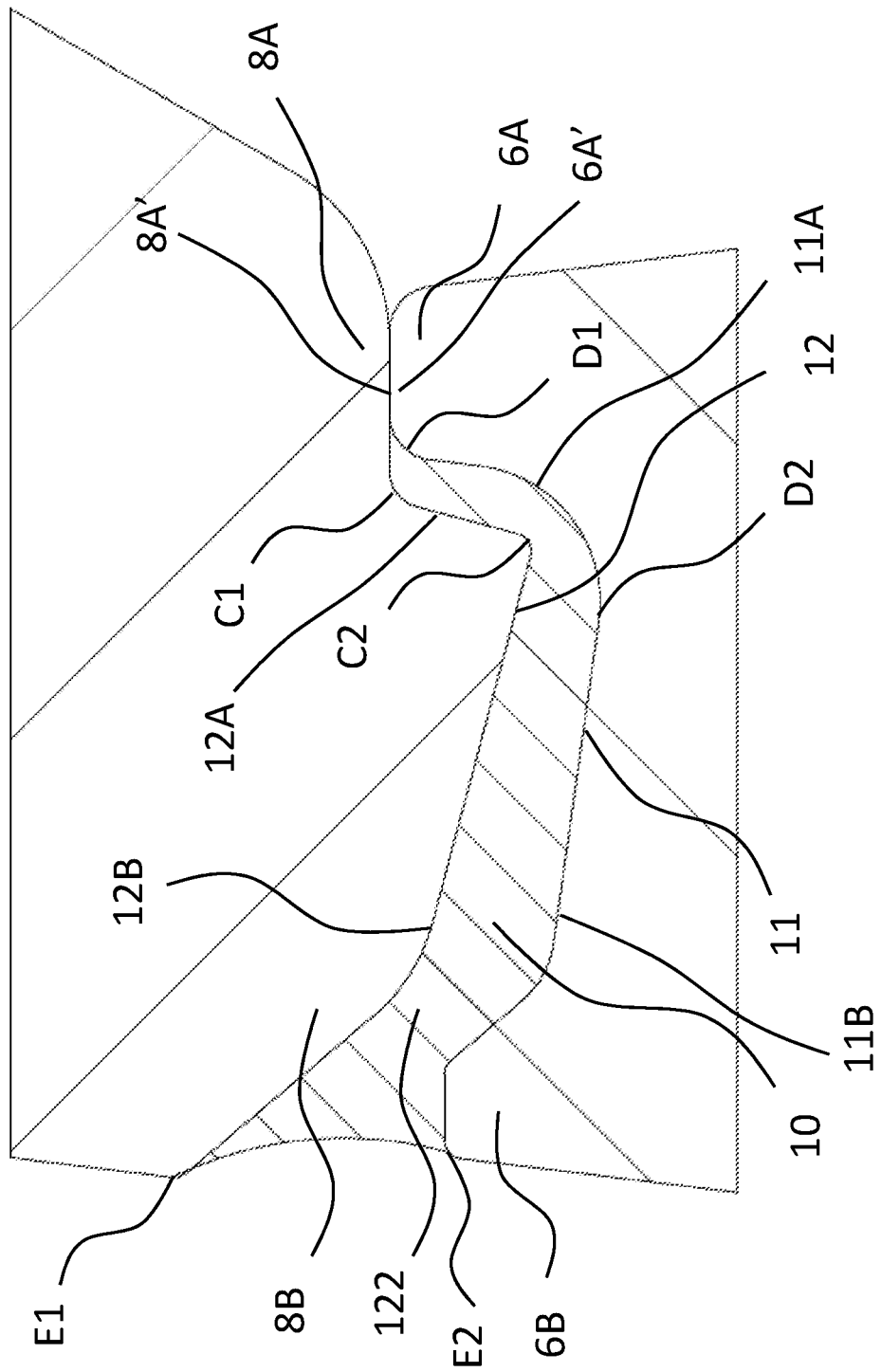

Comparing FIGS. 2A and 2B to the known package in FIG. 1, it can be seen that lid rim 8 comprises an inner portion 8A and an outer portion 8B. The same holds for upper ring part 6, which comprises an inner portion 6A and an outer portion 6B. Lower ring part 5 fixates leads 3 to substrate 2.

FIG. 2B illustrates how inner portion 6A of upper ring part 6 abuts with inner portion 8A of lid rim 8. It can be further seen that glue 122 is only present in channel 10 that is co-defined by outer portions 6B, 8B. FIG. 2B indicates that channel 10 is formed directly after inner portions 6A, 8A and before protrusion 12 that is formed in outer portion 6B, at least as seen from a center of packaged device 1. Moreover, channel 10 widens in the outward direction.

Protrusion 12 and recess 11, in which protrusion 12 extends, add to the lateral alignment of lid 7 relative to the remainder of the packaged device. On the other hand, the abutment of inner portions 6A, 8A allow for a well-defined height of the packaged device.

To manufacture device 1 in FIGS. 2A and 2B, adhesive 122 is arranged only in depression 11. Because electronic component 120 is already mounted at the time of applying the adhesive, it is preferred to couple lid 6 as soon as possible. For this reason, it is convenient to use an a-stage adhesive which requires a single heating step to couple lid rim 8 to upper ring part 6.

Figure 3A:
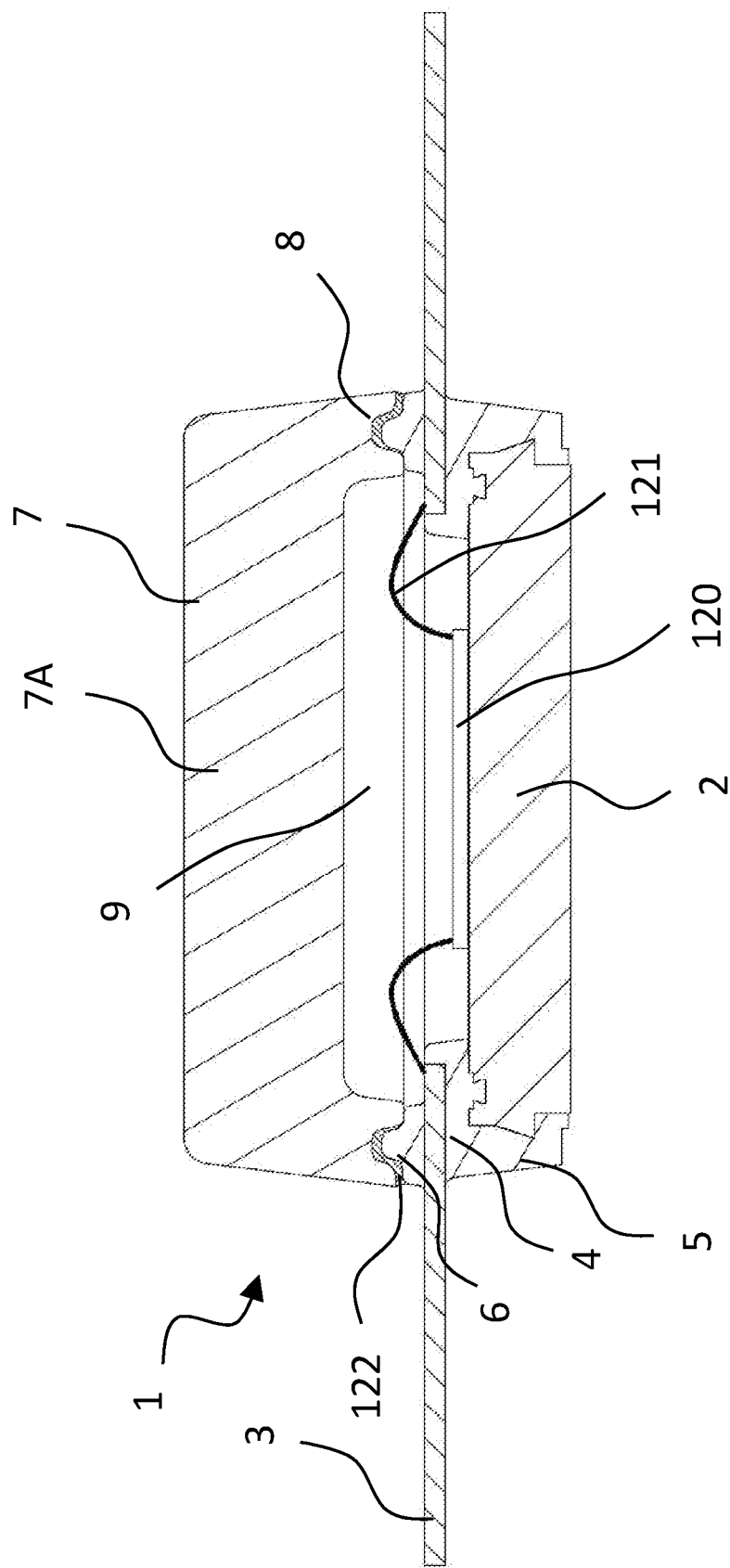
FIG. 3A illustrates a cross section of a second embodiment of a packaged electronic device in accordance with the invention, and FIG. 3B a corresponding detailed view of the connection between the lid rim and upper ring part.
Figure 3B:
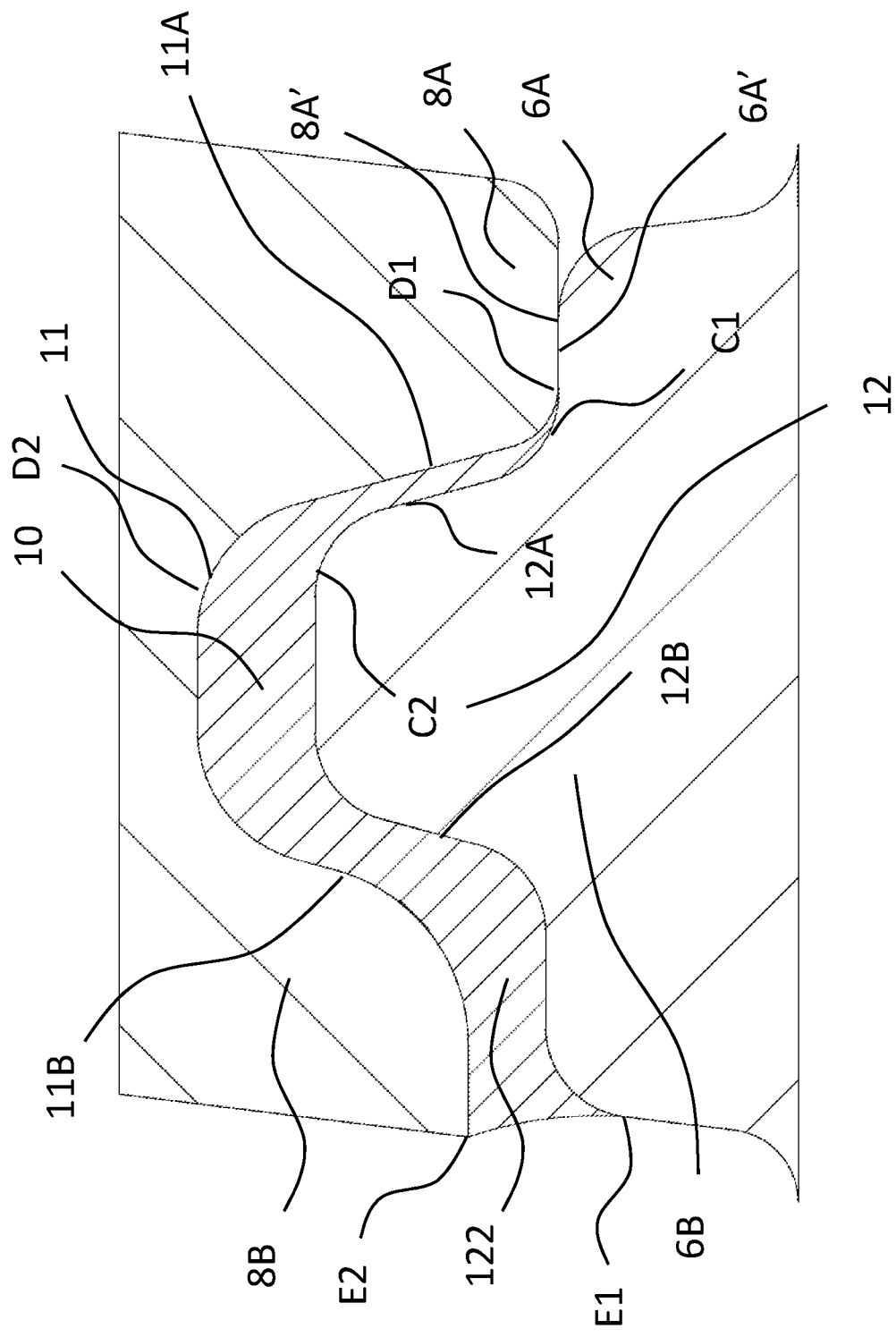

A different situation is shown in FIGS. 3A and 3B. Here, depression 11 is arranged in outer portion 8B, whereas protrusion 12 is formed in outer portion 6B. Here, it is possible to arrange the adhesive only in depression 11 at an earlier stage of manufacturing packaged device 1. For example, glue 122 may comprise a b-stage adhesive that has been partially cured to remove most of the solvent. In this stage, lid 8 may be stored for future use without risking the degradation of adhesive 122. At a later stage, lid 8 may be coupled to upper ring part 6 using a further heating step in which adhesive 122 cures.

Similar to FIG. 2B, channel 10 widens in an outward direction and starts directly after inner portions 6A, 8A and in front of protrusion 12, as seen from the center of packaged device 1.

Furthermore, in FIGS. 2B and 3B, it can be seen that inner portion 8A of lid rim 8 and inner portion 6A of upper ring part 6 comprise flanks 8A', 6A', respectively, that each extend substantially parallel to substrate 2. Therefore, when device 1 is arranged flat on a horizontal surface, flanks 8A', 6A' will constitute substantially horizontal surfaces. In this manner, the height of packaged device 1 in a direction perpendicular to substrate 2 is well defined as no adhesive is arranged in between flanks 6A', 8A'.

Depression 11 and protrusion 12 are formed adjacent to flanks 8A', 6A'. More in particular, protrusion 12 comprises a first flank 12A connected at a first connection point or line C1 to flank 8A', as in FIG. 2B, or to flank 6A', as in FIG. 3B, and extending from first connection point or line C1 towards upper ring part 6 or lid rim 8, respectively. Protrusion 12 further comprises a second flank 12B connected at a second connection point or line C2 to first flank 12A and ending at point or line E1 at an outside surface of packaged electronic device 1.

As can be seen in FIGS. 2B and 3B, a part of the channel formed between second flank 12B and opposing flank 11B of depression 11 is wider than a part of the channel formed between first flank 12A and opposing flank 11A of depression 11. Flank 11A is connected at a third connection point or line D1 to flank 6A', as in FIG. 2B, or to flank 8A', as in FIG. 3B. At a fourth connection point or line D2, flank 11B is connected to flank 11A, and flank 11B ends, at a point or line E2, at an outside surface of packaged electronic device 1.

Here, it is noted that the wording wider channel relates to the flow resistance encountered by the adhesive flowing in these channels when attaching the lid. More in particular, in a wider channel, the liquid adhesive may flow more easily than in a narrow channel. The width of the channel may be computed as the average cross sectional area computed perpendicular to a line or plane passing through the middle of the channel.

FIGS. 2B and 3B are cross sectional views Similar cross sectional views could be generated along the circumference of packaged device 1. For that reason, a point at which flanks connect, such as connection point C1 in FIG. 2B, actually corresponds to a line that extends around cavity 9 of packaged device 1.

Figure 4:
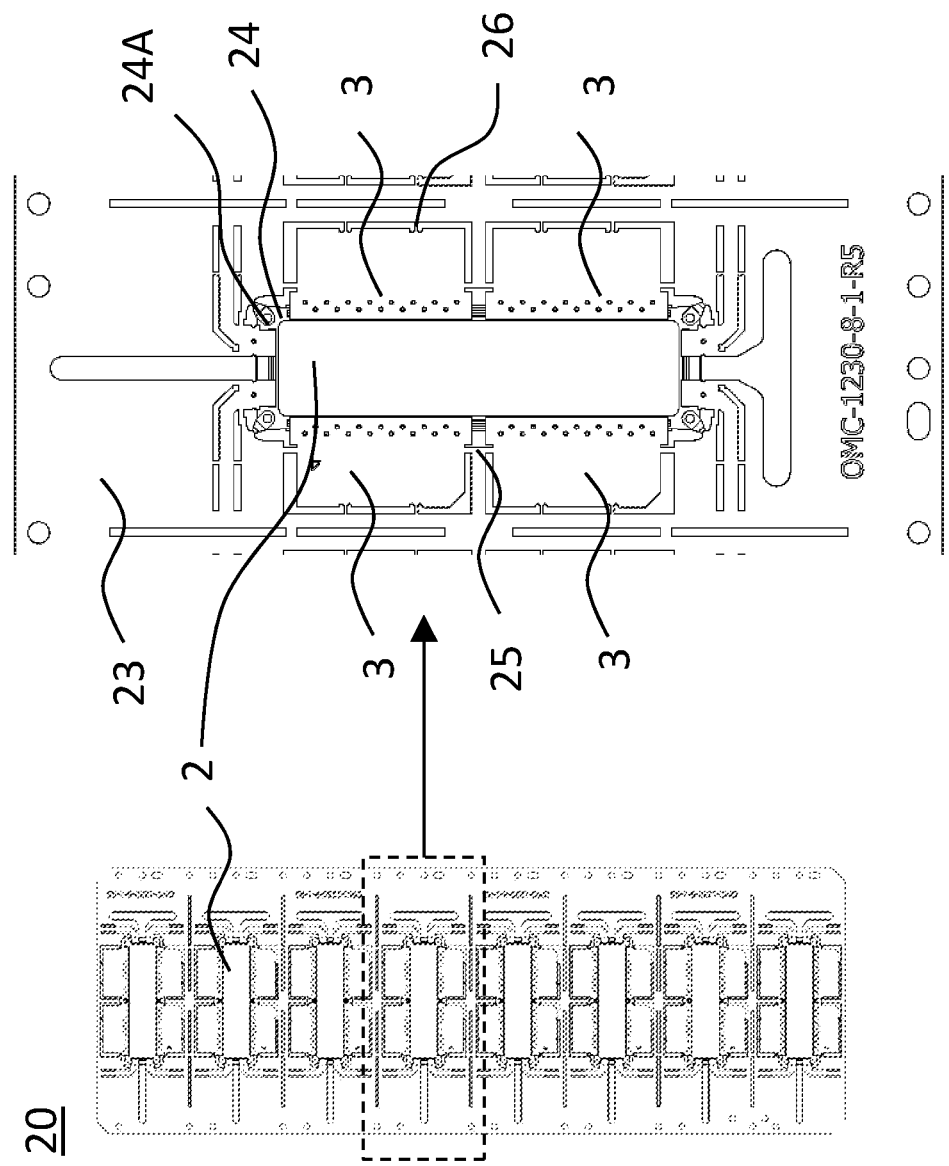
FIG. 4 illustrates a lead frame for manufacturing a plurality of packaged electronic devices as defined in claim 2A or 3A.

Second flank 12B does not touch opposing flank 11B of depression 11. In this manner, the channel between depression 11 and protrusion 12 is open at an outer end, whereas an inner end is closed off due to the abutment of flanks 8A', 6A'. Due to the open ended nature of the channel, there is little to no risk of air pockets forming in the adhesive. Such air pockets would degrade the reliability of the device when subjected to temperature and humidity stress tests. FIG. 4 illustrates a lead frame 20 for manufacturing a plurality of packaged electronic devices. Lead frame 20 comprises a plurality of substrates 2, a plurality of leads 3, and a lead frame body 23. Substrates 2 are connected to lead frame body 23 using tie-bars 24 which may include rivets 24A. In addition, leads 3 are connected to each other using dam-bars 25 and connected to lead frame body 23 using further connecting tabs 26. After having performed the steps described above related to connecting a lid to an upper ring part of a given package, the different electronic packages can be obtained by sawing, cutting, or punching through tie-bars 24, dam-bars 25, and connecting tabs 26.

Typically, substrates 2 are made from a different and/or thicker material than leads 3. Hence, substrates 2 may be connected, for example by means of rivets 24A, to lead frame body 23 at an earlier stage.

In the description above, the present invention has been described using detailed embodiments thereof. However, the skilled person will readily appreciate that the invention is not limited to these embodiments but that various modifications can be made without departing from the scope of invention which is defined by the appended claims.

The invention claimed is:

1. A packaged electronic device, comprising:
   a substrate, wherein the substrate comprises a flange, a heatsink, or a die pad for mounting one or more semiconductor dies;
   a plurality of leads fixated relative to the substrate in a spaced apart manner;
   a solidified molding compound that is fixedly connected to the plurality of leads and that comprises an upper ring part that extends away from the leads in a direction away from the substrate;
   an electronic component mounted on the substrate and being electrically connected to the plurality of leads;
   a lid having a lid base and a lid rim that extends towards the upper ring part, wherein the lid rim is connected to the upper ring part by means of an adhesive, each of the lid rim and the upper ring part comprising an inner portion and an outer portion relative to a center of the packaged electronic device, wherein the outer portion of the lid rim and the outer portion of the upper ring part are connected to each other using said adhesive, wherein the outer portion of the lid rim and the outer portion of the upper ring part co-define a channel in which the adhesive is arranged,
   wherein the inner portion of the lid rim and the inner portion of the upper ring part abut each other without the adhesive being arranged in between them,
   wherein the channel widens in an outward direction relative to said center of the packaged electronic device,
   wherein the outer portion of the lid rim comprises a depression,
   wherein the upper ring part comprises a protrusion that extends in said depression,
   wherein the channel starts directly adjacent the inner portion of the upper ring part and in front of the protrusion when seen from the center of the packaged electronic device,
   wherein the inner portion of the lid rim comprises a first flank,
   wherein the inner portion of the upper ring part comprises a second flank,
   wherein the first flank and the second flank abut each other and each extend substantially parallel to the substrate,
   wherein the depression and the protrusion are formed adjacent to the first flank and the second flank,
   wherein the protrusion comprises a third flank connected to the second flank and extending therefrom towards the lid rim, the protrusion further comprising a fourth flank connected to the third flank and ending at an outside surface of the packaged electronic device,
   wherein a part of the channel formed between the fourth flank and an opposing flank of the depression is wider than a part of the channel formed between the third flank and an opposing flank of the depression, and
   wherein the channel is open at the outside surface of the packaged electronic device and is closed off at an opposing end of the channel due to the abutment of the first and second flanks.

2. The packaged electronic device according to claim 1, further comprising a cavity in between the substrate and the lid that is free from said molding compound, wherein the electronic component is arranged in the cavity, wherein the abutment of the inner portion of the lid rim and the inner portion of the upper ring part forms a mechanical barrier that prevented glue from reaching the cavity during connecting the upper ring part and the lid rim to each other using the adhesive by application of heat and/or pressure and/or ultraviolet (UV) exposure.

3. The packaged electronic device according to claim 2, wherein each lead of the plurality of leads comprises a mounting region near an inward end of the lead that is free of said molding compound, the packaged electronic device further comprising electrical connections, such as one or more bondwires, that electrically connect electrical terminals of the electronic component to the mounting regions of the plurality of leads.

4. The packaged electronic device according to claim 1, wherein the protrusion and the depression are shaped to allow alignment of the lid relative to the upper ring part during application of the lid.

5. The packaged electronic device according to claim 1, wherein the depression and the protrusion each extend along an entire circumference of the lid rim or the upper ring part.

6. The packaged electronic device according to claim 1, wherein the adhesive comprises a cured b-stage adhesive.

7. The packaged electronic device according to claim 1, wherein, viewed in a direction perpendicular to the substrate, a height of the protrusion is larger than a maximum inner size of the channel.

8. The packaged electronic device according to claim 1, wherein the molding compound comprises a lower ring part that fixates the plurality of leads relative to the substrate.

9. The packaged electronic device according to claim 1, wherein the electronic component comprises an integrated circuit (IC) chip and/or a semiconductor chip comprising one or more transistors.

10. The packaged electronic device according to claim 1, wherein the lid is made from a same molding compound as said solidified molding compound.

11. A method for manufacturing the packaged electronic device according to claim 1, comprising:
    a) providing a lead frame comprising a lead frame body, the substrate, and the plurality of leads;
    b) applying a molding compound to the plurality of leads and the substrate;
    c) allowing the applied molding compound to solidify thereby forming the solidified molding compound fixating the leads relative to the substrate in the spaced apart manner;
    d) mounting the electronic component on the substrate and electrically connecting the electronic component to the plurality of leads;
    e) providing the lid;
    f) positioning the lid and the upper ring part such that the inner portion of the lid rim and the inner portion of the upper ring part abut each other, said positioning resulting in the formation of a cavity in between the substrate and the lid in which the electronic component is arranged, wherein the abutment of the inner portion of the lid rim and the inner portion of the upper ring forms a mechanical barrier, wherein the outer portion of the lid rim and the outer portion of the upper ring part are shaped such that they, after being positioned, co-define the channel; and
    g) connecting the outer portion of the upper ring part and the outer portion of the lid rim to each other using the adhesive by applying heat and/or pressure and/or ultraviolet (UV) exposure, wherein the mechanical barrier prevents glue from reaching the cavity during said connecting the upper ring part and lid rim to each other, wherein the inner portion of the lid rim and the inner portion of the upper ring part abut each other without the adhesive being arranged in between them,
    wherein the adhesive comprises a b-stage adhesive, and wherein step e) comprises:
        e1) applying the adhesive solely to the outer portion of the lid rim;
        e2) heating the adhesive to remove a majority of solvent from the adhesive; and
        e3) storing the lid prior to further use.

12. The method according to claim 11, wherein the lead frame comprises a plurality of said substrates, and, for each of the plurality of said substrates, a plurality of said leads, wherein the plurality of said substrates and the plurality of said leads are connected to the lead frame body using one or more temporary connections such as connecting tabs and/or tie-bars, and wherein the steps b)-g) are performed on all of the plurality of said substrates and the plurality of said leads of the lead frame simultaneously.

13. The method according to claim 12, wherein the plurality of said leads are mutually connected using dam-bars.

14. The method according to claim 13, further comprising obtaining a plurality of said packaged electronic devices by means of sawing, punching, or cutting through the temporary connections and/or the dam-bars.

15. The method according to claim 11, wherein step b) comprises applying the molding compound to the plurality of leads and the substrate by means of transfer or injection molding.

\* \* \* \* \*